US010163926B2

(12) United States Patent
Lai et al.

(10) Patent No.: US 10,163,926 B2
(45) Date of Patent: Dec. 25, 2018

(54) MEMORY DEVICE AND METHOD FOR FABRICATING THE SAME

(71) Applicant: MACRONIX INTERNATIONAL CO., LTD., Hsinchu (TW)

(72) Inventors: Erh-Kun Lai, Taichung (TW); Hsiang-Lan Lung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/595,974

(22) Filed: May 16, 2017

(65) Prior Publication Data

US 2018/0337191 A1    Nov. 22, 2018

(51) Int. Cl.
| H01L 21/8228 | (2006.01) |
| H01L 27/11582 | (2017.01) |
| H01L 27/1157 | (2017.01) |
| H01L 29/423 | (2006.01) |
| H01L 21/28 | (2006.01) |
| H01L 23/535 | (2006.01) |

(52) U.S. Cl.
CPC .. *H01L 27/11582* (2013.01); *H01L 21/28282* (2013.01); *H01L 23/535* (2013.01); *H01L 27/1157* (2013.01); *H01L 29/4234* (2013.01)

(58) Field of Classification Search
CPC ........... H01L 27/11582; H01L 27/1157; H01L 29/4234; H01L 27/11568; H01L 23/528; H01L 23/535
USPC ........................................................ 257/324
See application file for complete search history.

(56) References Cited

U.S. PATENT DOCUMENTS

| 9,324,730 | B2 | 4/2016 | Nam et al. |
| 9,331,095 | B2 | 5/2016 | Shim et al. |
| 9,379,122 | B2 | 6/2016 | Shin et al. |
| 9,379,131 | B2 | 6/2016 | Lai |
| 9,559,113 | B2 | 1/2017 | Lai |
| 2011/0002178 | A1* | 1/2011 | Hwang ............. H01L 27/11578 365/189.011 |

(Continued)

OTHER PUBLICATIONS

Noh, et al.: "A New Metal Control Gate Last Process (MCGL process) for High Performance DC-SF (Dual Control gate with Surrounding Floating gate) 3D NAND Flash Memory"; 2012 Symposium on VLSI Technology Digest of Technical Papers; pp. 19-20.

*Primary Examiner* — Theresa T Doan
(74) *Attorney, Agent, or Firm* — McClure, Qualey & Rodack, LLP

(57) ABSTRACT

A memory device memory device includes a multi-layers stack, a charge-trapping layer, a first channel layer and a SSL switch. The multi-layers stack includes a plurality of insulating layers, a plurality of conductive layers alternatively stacked with the insulating layers and at least one first through opening passing through the conductive layers. The charge-trapping layer blankets over a sidewall of the first through opening. The first channel layer is disposed in the first through opening. The SSL switch is disposed on the multi-layers stack and includes a second channel layer, a gate dielectric layer and a gate. The second channel layer is disposed on and electrically contacting to the first channel layer. The gate dielectric layer is disposed on the second channel layer and made of a material other than that for making the charge-trapping layer. The gate is disposed on the gate dielectric layer.

8 Claims, 9 Drawing Sheets

(56) References Cited

U.S. PATENT DOCUMENTS

2011/0032772 A1* 2/2011 Aritome ............ H01L 27/11551
365/185.29
2015/0221351 A1   8/2015 Park et al.
2015/0318299 A1  11/2015 Lai

* cited by examiner

MEMORY DEVICE AND METHOD FOR FABRICATING THE SAME

BACKGROUND

Technical Field

The disclosure of the present disclosure generally relates to a memory device and the method for fabricating the same, and more particularly to a non-volatile memory (NVM) device and the method for fabricating the same.

Description of the Related Art

Non-volatile memory (NVM) devices which are able to continually store information even when the supply of electricity is removed from the device containing the NVM cells has been widespread adopted by bulk solid state memory applications in portable audiovisual entertainment devices, cell phones or digital cameras etc. Recently, various 3D memory devices, such as a 3D vertical-channel (VC) flash memory device that has a multi-layer stack structure may possess a higher density memory and excellent electrical characteristics, e.g. reliability in data storage and high operating speed, has been provided in order to accommodate the rising demand for superior memory.

A typical method for fabricating a 3D VC NVM device includes steps as follows: A plural of insulating layers and conductive layers alternatively stacked with each other is firstly formed. A plurality of trenches are then formed in the multi-layers stack to divide the multi-layers stack into a plurality of rigid stacks each of which has a plurality of conductive strips formed by the patterned conductive layers. A charge-trapping layer with an ONO composite layers structure (including a silicon oxide layer, a silicon nitride layer and another silicon oxide layer) and a channel layer are formed in sequence on the bottoms and sidewalls of the trenches, so as to define a plurality switches at the intersection points of the conductive strips, the charge-trapping layer and the channel layer. However, merely the switches defined on the middle-levels conductive strips of each rigid stack can serve as memory cells for being connected in series by the channel layer to form a memory cells string. The switch that is defined on the topmost of the rigid stack may serve as a string selection (SSL) switch the memory cells string respectively.

Because, the SSL switch includes a portion of the charge-trapping layer and connected in series with the memory cells by the channel layer, the SSL switch may be charged while the memory cells are subjected to a programing/erasing process, and an undesirable threshold-voltage shift of the SSL switch may occur. In order to remain the threshold-voltage of the SSL switch stable, addition control circuitry is thus needed to manipulate voltages applied to the SSL switch to compensate the undesirable threshold-voltage shift. As a result, the power consumption of the 3D VC NVM device may be increased and its operation efficiency may be declined.

Therefore, there is a need of providing a memory device and the method for fabricating the same to obviate the drawbacks encountered from the prior art.

SUMMARY

In one Embodiment of the present disclosure, a memory device is disclosed, wherein the memory device includes a multi-layers stack, a charge-trapping layer, a first channel layer and a SSL switch. The multi-layers stack includes a plurality of insulating layers, a plurality of conductive layers alternatively stacked with the insulating layers and at least one first through opening passing through the conductive layers. The charge-trapping layer blankets over a sidewall of the first through opening. The first channel layer is disposed in the first through opening. The SSL switch is disposed on the multi-layers stack and includes a second channel layer, a gate dielectric layer and a gate. The second channel layer is disposed on and electrically connecting to the first channel layer. The gate dielectric layer is disposed on the second channel layer and made of a material other than that for making the charge-trapping layer. The gate is disposed on the gate dielectric layer.

In accordance with another embodiment of the present disclosure, a method for fabricating a memory device is provided, wherein the method includes steps as follows: Firstly, a multi-layers stack having a plurality of insulating layers, a plurality of conductive layers and at least one first through opening is provided, wherein the insulating layers and the conductive layers are alternatively stacked with each other, and the first through opening passes though the conductive layers. A charge-trapping layer is formed to blanket over a sidewall of the first through opening, and a first channel layer is formed in the first through opening, whereby a plurality of memory cells are defined on the intersection points of the charge-trapping layer, the first channel layer and the conductive layers. A SSL switch including a second channel layer, a gate dielectric layer and a gate is formed on the multi-layers stack, wherein the second channel layer is disposed on and electrically connecting to the first channel layer; the gate dielectric layer is disposed on the second channel layer and made of a material other than that for making the charge-trapping layer; and the gate is disposed on the gate dielectric layer.

In accordance with the aforementioned embodiments of the present disclosure, a memory device and method for fabricating the same are provided. A SSL switch including a channel layer, a gate dielectric layer and a gate is independently formed on a multi-layers stack and electrically connected in series with a memory cells string formed in the multi-layers stack. Because the channel layer of the SSL switch is made of a material other than that for making the charge-trapping layer of the memory cells string, undesirable threshold-voltage shift of the SSL switch due to the charging of the charge-trapping layer during the programing/erasing process of the memory cells string may not occur. Such that, additional circuitry used to compensate the undesirable threshold-voltage shift is no longer required, the power consumption of the memory device can be decreased and the operation efficiency thereof may be improved.

The above objects and advantages of the present disclosure will become more readily apparent to those ordinarily skilled in the art after reviewing the following detailed description and accompanying drawings, in which:

DETAILED DESCRIPTION

Figure 1A:
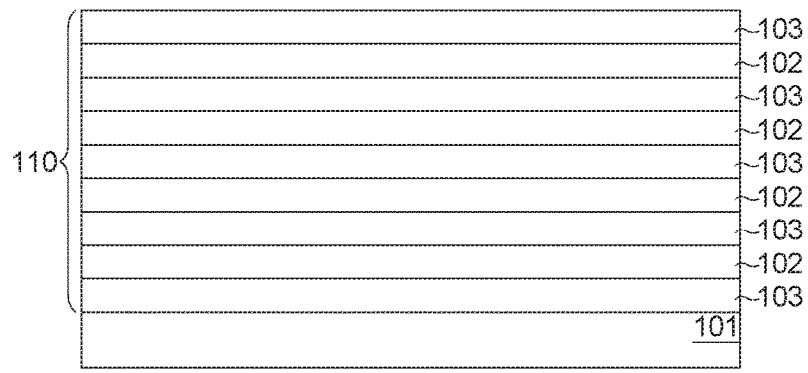
FIGS. 1A to 1K are cross-sectional views illustrating the processing structures for forming a memory device in accordance with one embodiment of the present disclosure.
Figure 1B:
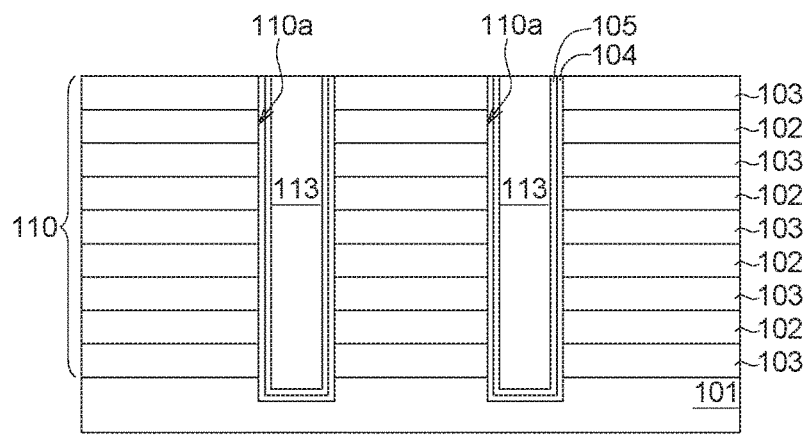

The embodiments as illustrated below provide a memory device and the method for fabricating the same to decrease the power consumption improve the operation efficiency thereof. The present disclosure will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

FIGS. 1A to 1K are cross-sectional views illustrating the processing structures for forming a memory device 100 in accordance with one embodiment of the present disclosure. In the present embodiment, the memory device 100 is a vertical channel NAND flash memory device. The method for fabricating the memory device 100 includes steps as follows: Firstly, a semiconductor substrate 101 is provided, and a multi-layers stack 110 is then formed on the semiconductor substrate 101. In some embodiments of the present disclosure, the semiconductor substrate 101 may be made of a p-type doped, n-type doped or undoped semiconductor material, such as poly-silicon, germanium (Ge) or any other suitable semiconductor material. The multi-layers stack 110 includes a plurality of insulating layers 103 and a plurality of sacrificing layers 102 alternatively stacked with each other. In the present embodiment, the insulating layers 103 and the sacrificing layers 102 are parallel to each other and alternatively and stacked on the semiconductor substrate 101 along the Z axis, wherein the bottommost insulating layer 103 contacts to the semiconductor substrate 101 and the sacrificing layers 102 are electrically isolated from the semiconductor substrate 101 by the insulating layers 103 (see FIG. 1A).

In some embodiments of the present disclosure, the sacrificing layers 102 and the insulating layers 103 may be both formed by a low pressure chemical vapor deposition (LP-CVD), however, the material for configuring the sacrificing layers 102 may be different from that for configuring the insulating layers 103. For example, the insulating layers 102 may be made of silicon-nitride compounds, such as SiN, SiON, silicon carbonitride (SiCN), or the arbitrary combinations thereof. The insulating layers 103 may be made of dielectric material other than the material made of the sacrificing layers 102, such as silicon oxide, silicon carbide (SiC), silicate or the arbitrary combinations thereof. In the present embodiment, the sacrificing layers 102 are made of SiN with a thickness ranging from 100 Å to 600 Å, typically ranging from 200 Å to 400 Å; and the insulating layers 103 are made of silicon dioxide ($SiO_2$) with a thickness about ranging from 100 Å to 600 Å, and typically ranging from 200 Å to ~400 Å.

Next, an etching process is performed to form a plurality of first through openings 110a passing through the sacrificing layers 102, so as to expose a portion of the bottommost insulating layer 103. In some embodiments of the present disclosure, the etching process can be an anisotropic etching process, such as a reactive ion etching (RIE) process, performed on the multi-layers stack 110 using a patterned hard mask layer (not shown) as an etching mask. The first through openings 110a may be a plurality of through holes formed in the multi-layers stack 110 along the Z axis used to expose a portion of the bottommost insulating layer 103 serving as the bottom of the through openings 110a and to expose portions of the sacrificing layers 102 and the insulating layers 103 serving as the sidewalls of the first through openings 110a.

Subsequently, a charge-trapping layer 104 and a first channel layer 105 are formed in sequence on sidewalls of the first through openings 110a to make the charge-trapping layer 104 disposed between the first channel layer 105 and the remaining sacrificing layers 102. The first through openings 110a are then fulfilled by an insulating material 113 (see FIG. 1B). In some embodiments of the present disclosure, the charge-trapping layer 104 may be a composite layer having (but not limited to) oxide-nitride-oxide (ONO), oxide-nitride-oxide-nitride-oxide (ONONO) or oxide-nitride-oxide-nitride-oxide-nitride-oxide (ONONONO) structure. The first channel layer 105 may be made of un-doped poly-silicon, undoped silicon-germanium (SiGex), germanium (Ge), or gallium indium zinc oxide (GIZO), and so on. The insulating material 113 may include silicon dioxide ($SiO_2$).

Figure 1C:
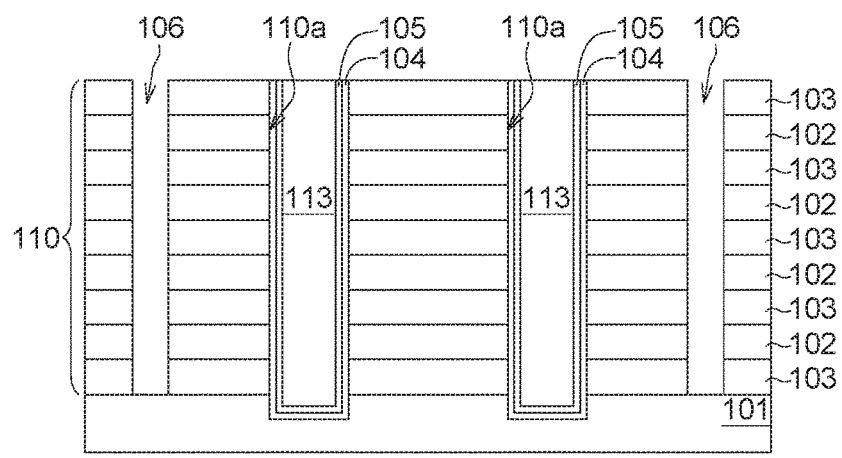

Subsequently, another etching process is performed to form at least one second through opening 106 passing through the multi-layers stack 110 along the Z axis from the top surface of the multi-layers stack 110, so as to partially expose the sacrificing layers 102, the insulating layers 103 and the top surface of the semiconductor substrate 101 (see FIG. 1C). In some embodiments of the present disclosure, the at least one second through opening 106 can be a plurality of slits passing through the multi-layers stack 110.

The remaining sacrificing layers 102 are then removed. In the present embodiment, phosphoric acid ($H_3PO_4$) solution is utilized to remove the remaining sacrificing layers 102 through the second through openings 106, so as to form a plurality of space 107 between the insulating layers 103 and the charge-trapping layer 104. Next, a plurality of conductive layers 108 are formed on the positions (the space 107) where the remaining sacrificing layers 102 initially occupied. As a result, a memory cells 109a can be defined at each intersection point of the conductive layers 108, the charge-trapping layer 104 and the first channel layer 105, so as to form at least one memory cells string including a plurality of the memory cells 109a electrically connected in series by the first channel layer 105 in the multi-layers stack 110.

In some embodiments of the present disclosure, the conductive layers 108 may be made of poly-silicon, metal or other suitable conductive material. In the present embodiment, the conductive layers 108 are a plurality metal layers made of tungsten (W), titanium nitride (TiN), tantalum nitride (TaN) or the arbitrary combinations thereof. In some embodiments, prior to the forming of the conductive layers 108, a high-dielectric-constant (high-K) dielectric liner made of aluminum oxide ($Al_2O_3$), hafnium oxide (HfOx), zirconium oxide (ZrOx) or the arbitrary combinations thereof (not shown) may be formed by an LPCVD process on the sidewalls of the space 107 defined by the insulating layers 103 and the charge-trapping layer 104.

Figure 1D:
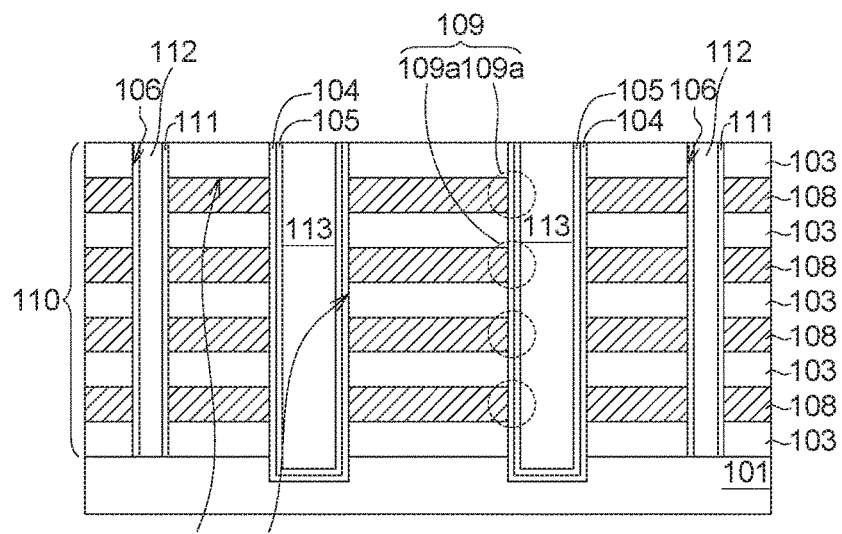
Figure 1E:
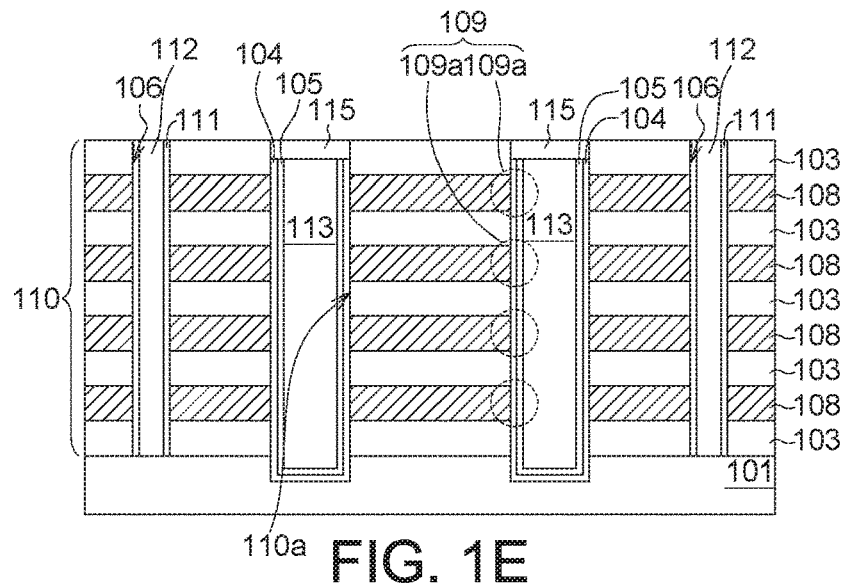
Figure 1F:
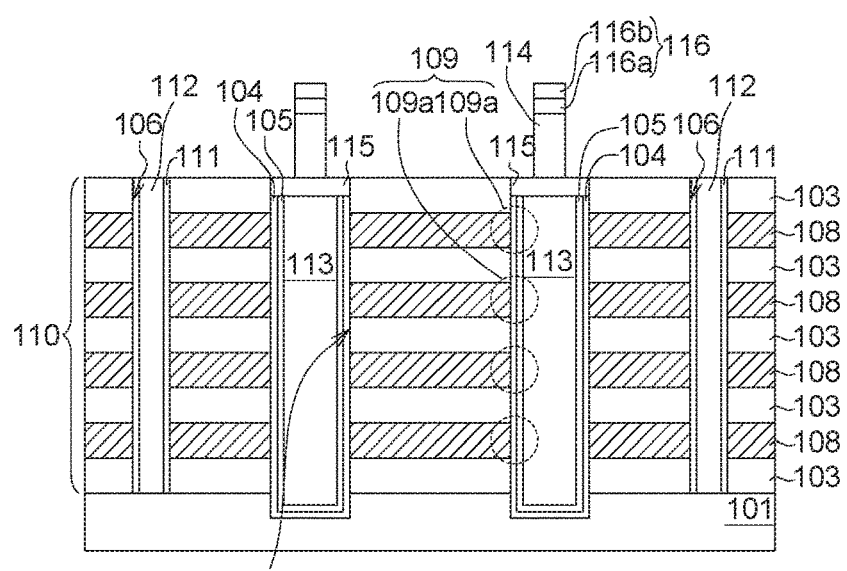

After the forming of the conductive layers 108, a dielectric isolation layer 111 is formed on the sidewalls of the second through openings 106, and a contact plug 112 is then formed in the second through openings 106 (see FIG. 1D). In some embodiments of the present disclosure, the forming of the dielectric isolation layer 111 and the contact plug 112 includes steps as follows: An epitaxial silicon film is firstly grown on the sidewalls and the bottom of the second through openings 106 by a deposition process; and a low temperature oxidation (LTO) process is then performed under an operation temperature ranging from 300° C. to 450° C. with reaction gases to form a silicon oxide layer on the sidewalls and the bottom of the second through openings 106. After a portion of the dielectric isolation layer 111 disposed on the bottom of the second through openings 106 is removed, the second through openings 106 are fulfilled with a conductive material, such as metal (e.g. titanium (Ti), W, Aluminum (Al), copper (Cu), gold (Au), silver (Ag) or the alloys of these metals), metal oxide (e.g. titanium nitride (TiN)) or other suitable material, formed by a deposition process (e.g. by an LPCVD process). A contact plug 112 electrically isolated from the conductive layers 108 by the dielectric isolation layer 111, and electrically contacting to the semiconductor substrate 101 is thus formed in each of the second through openings 106.

Thereafter, a bond pad 115 is formed in each of the first through openings 110a electrically contacting the first channel layer 105. In some embodiments of the present disclosure, the forming of the bond pads 115 includes steps as follows: A portion of the insulating material 113 fulfilled in the first through openings 110a is firstly removed by an etching back process. A doped poly-silicon layer, a SiGex layer or a Ge layer (not shown) is then formed on the multi-layers stack 110 to fill the first through openings 110a. Next, a planarization process, such as a chemical mechanical polishing (CMP) process, using the topmost insulating layers 103 of the multi-layers stack 110 as a stop layer is performed to remove the portions of the doped poly-silicon layer (not shown) disposed on the topmost insulating layers 103, so as to form the bond pads 115 exposed from the first through openings 110a (see FIG. 1E).

Although the charge-trapping layer 104, the first channel layer 105, the insulating material 113 and the bond pad 115 disclosed in the aforementioned embodiments are formed after the forming of the second through opening 106, but it is not limited to this regards. In some embodiments of the present disclosure, the charge-trapping layer 104, the first channel layer 105, the insulating material 113 and the bond pad 115 can be formed prior to the forming of the second through opening 106.

After the bond pads 115 are formed, a channel material layer (not shown), such as (but not limited to) a poly-silicon layer having a thickness substantially ranging from 800 angstrom (Å) to 1000 Å, is formed on the bond pads 115 and the multi-layers stack 110 in a manner of electrically contacting to the bond pads 115. A patterned hark mask layer 116 including a capping layer 116a and a silicon nitride layer 116b stacked with each other is then formed on the channel material layer. Next, an etching process using the patterned hark mask layer 116 as an etching mask is performed to remove a portion of the channel material layer and to make the remaining portion of the channel material layer having a plurality of columnar structure, each of which can serve as a channel layer (hereinafter referred as the second cannel layer 114) of a SSL switch 120 (that will be described later) (see FIG. 1F).

In some embodiments of the present disclosure, the second cannel layer 114 aligns to one of the bond pads 115 and though which electrically connects to the first channel layer 105. The cross-section of the second cannel layer 114 perpendicular to the Z axis has an area substantially less than that of the corresponding bond pad 115 formed in the corresponding first through opening 110a. In other words, the cross-section of the second cannel layer 114 is smaller than the first through opening 110a. In comparison to the first channel layer 105 which blankets over the sidewalls of the first through opening 110a, the bond pads 115 that are formed by doped poly-silicon filled in one of the first through opening 110a has a greater cross-section. Such that, the bond pads 115 can provide the second cannel layer 114 a greater process window to formed thereon and electrically connect to the first channel layer 105.

Figure 1G:
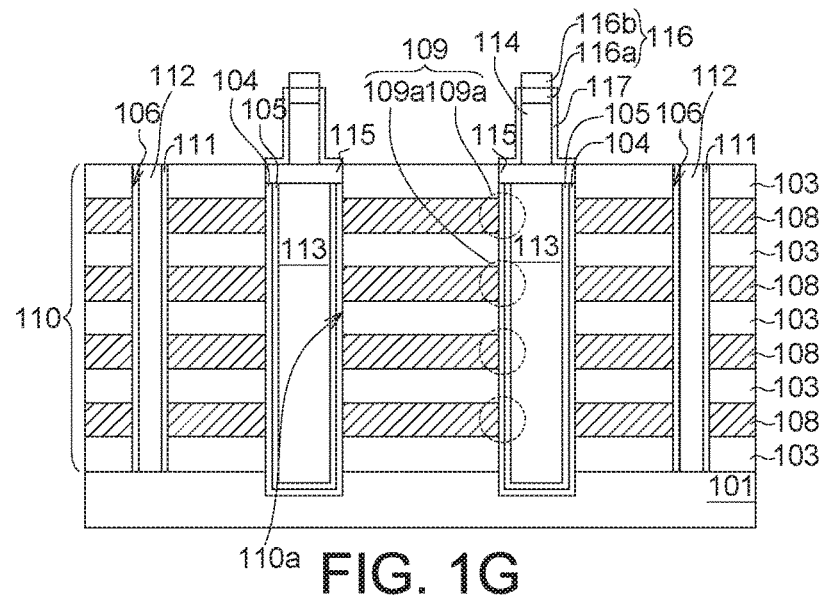
Figure 1H:
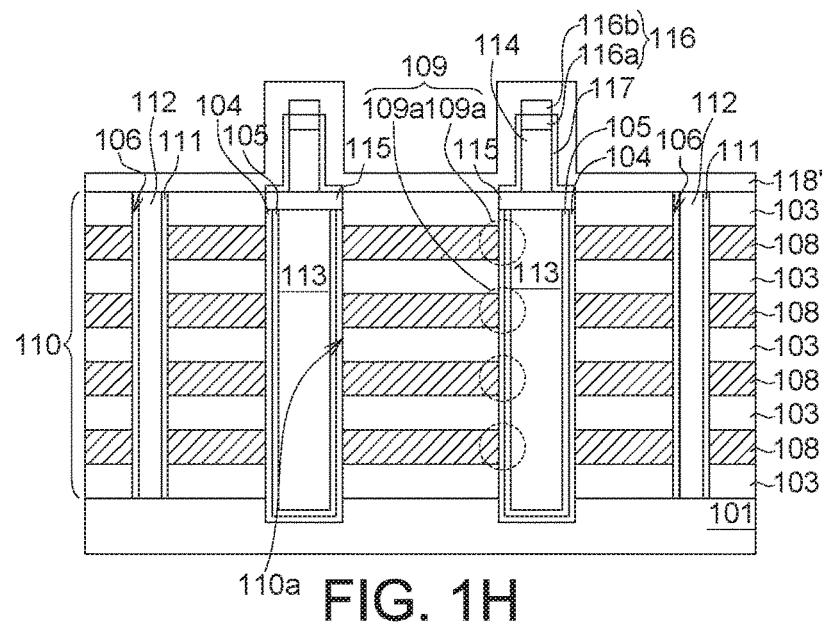

Next, a gate dielectric layer 117 is formed on the second cannel layer 114 (see FIG. 1G). In some embodiments of the present disclosure, the forming of the gate dielectric layer 117 includes performing an oxidation process (e.g. LTO process) to form a silicon oxide layer on the sidewalls of the second cannel layer 114. However, the method for forming of the gate dielectric layer 117 may not be limited to this regards, in some other embodiments, the gate dielectric layer 117 can be formed by steps as follows: A dielectric material layer (not shown), such as a silicon oxide layer or a high-K dielectric layer, is firstly formed on the multi-layers stack 110, the bond pads 115, the patterned hark mask layer 116 and the second cannel layer 114 by a deposition process, e.g. LPCVD. The dielectric material layer (not shown) is then patterned by an etching process to form the gate dielectric layer 117 covering on the bond pads 115 and the second cannel layer 114.

Subsequently, a gate is formed on the gate dielectric layer 117. In some embodiments of the present disclosure, the forming of the gate can be formed by steps as follows: A conductive layer 118' is firstly formed on the multi-layers stack 110, the patterned hard mask layer 116 and the gate dielectric layer 117 (see FIG. 1H). The conductive layer 118' is then patterned by an etching process, for example, to make the remaining portions of the conductive layer 118' at least covering on the patterned hark mask layer 116 and the gate dielectric layer 117. A dielectric layer 119 is next formed on the multi-layers stack 110 and the patterned conductive layer 118'. A planarization process, e.g. a CMP process, using the patterned hard mask layer 116 as a stop layer is performed to remove portions of the dielectric layer 119 and the patterned hark mask layer 116. One columnar structure of the second cannel layer 114, and the remaining portions of the conductive layer 118' and the gate dielectric layer 117 disposed on one sidewall of the columnar structure can assembled to form a SSL switch 120, wherein the remaining portion of the conductive layer 118' can serve as the gate (hereinafter referred as the gate 118) of the SSL switch 120 (see FIG. 1I).

In some embodiments of the present disclosure, the conductive layer 118' may be made of a conductive material, such as metal (e.g. titanium (Ti), W, Aluminum (Al), copper (Cu), gold (Au), silver (Ag) or the alloys of these metals), metal oxide (e.g. titanium nitride (TiN)) or other suitable material. The dielectric layer 119 may include $SiO_2$. The gate dielectric layer 117 may include silicon oxide, and has a thickness substantially greater than that of the charge-trapping layer 104. In the present embodiment, the gate dielectric layer 117 has a thickness substantially ranging from 30 Å to 150 Å, and typical ranging from 60 Å to 80 Å.

Figure 1I:
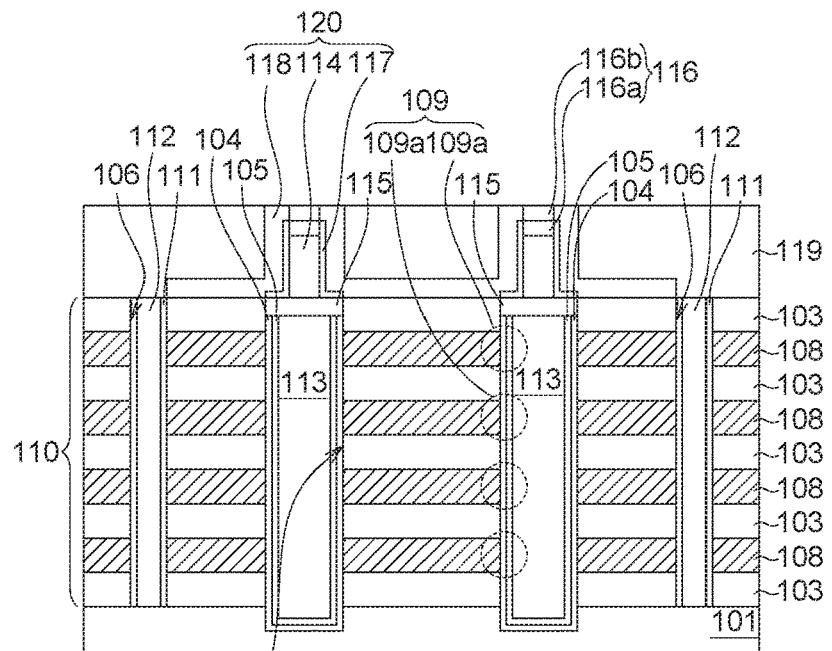
Figure 1J:
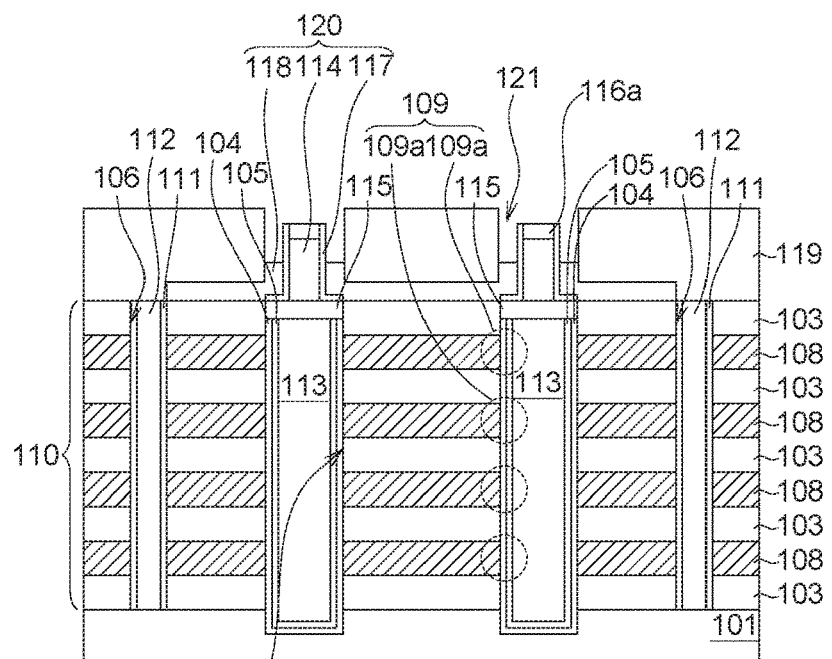

A PAN solution including phosphoric acid ($H_3PO_4$), ammonium hydroxide ($NH_4OH$) and nitric acid ($HNO_3$) is applied to remove the silicon nitride layer 116b and portions of the gate 118 and the dielectric layer 119, so as to form a plurality of recesses 121 in the dielectric layer 119, from which the capping layer 116a and potions of the gate 118 and the gate dielectric layer 117 are exposed (see FIG. 1J).

Figure 1K:
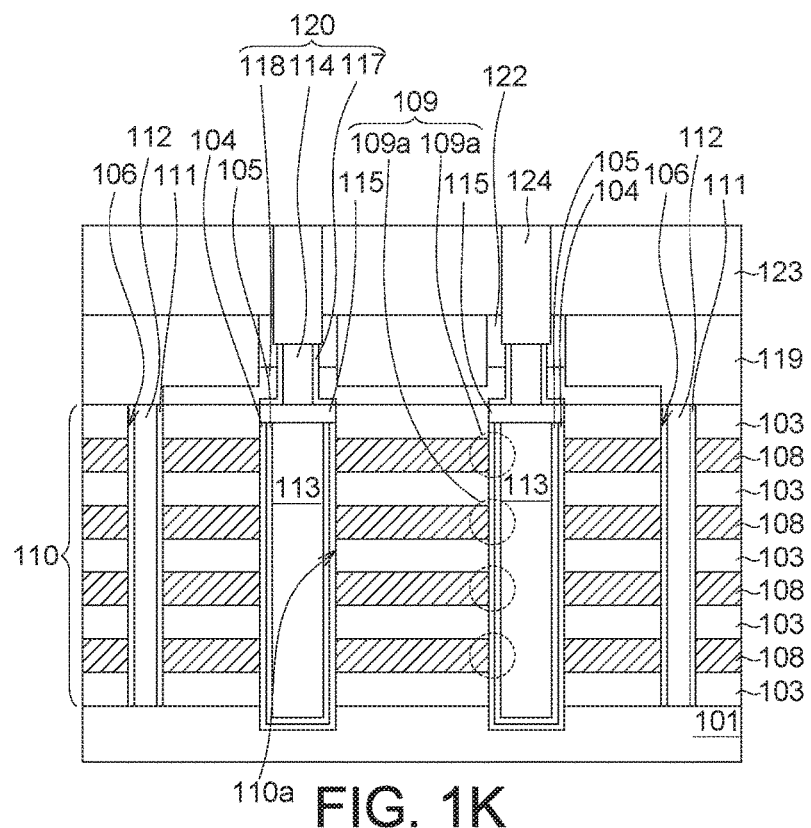

Subsequently, an insulating material 122, such as silicon nitride, is used to fulfill the recesses 121. After the insulating material 122 is planarized, a protection layer 123 is formed on the dielectric layer 119. A plurality of bit lines 124 passing through the protection layer 123 and the capping layer 116a are then formed to electrically contact to the second channel layer 114 and to be isolated from the gate 118 by the insulating material 122. Finally, a series back end of line (BEOL) processes are carried out to accomplish the memory device 100 as shown in FIG. 1K.

Because the SSL switch 120 and the memory cells string 109 are not formed by the same process; and the material and structure of the channel layer (the second channel layer 114) of the SSL switch 120 is different from that of the charge-trapping layer 104 used to define the memory cell 109a, the SSL switch 120 does not include any charge-trapping layer. Thus, undesirable threshold-voltage shift of the SSL switch due to the charging of the charge-trapping layer 104 during the programing/erasing process of the memory cell 109a may not occur. Such that, additional circuitry used to compensate the undesirable threshold-voltage shift is no longer required, the power consumption of the memory device can be decreased and the operation efficiency thereof may be improved.

Figure 2A:
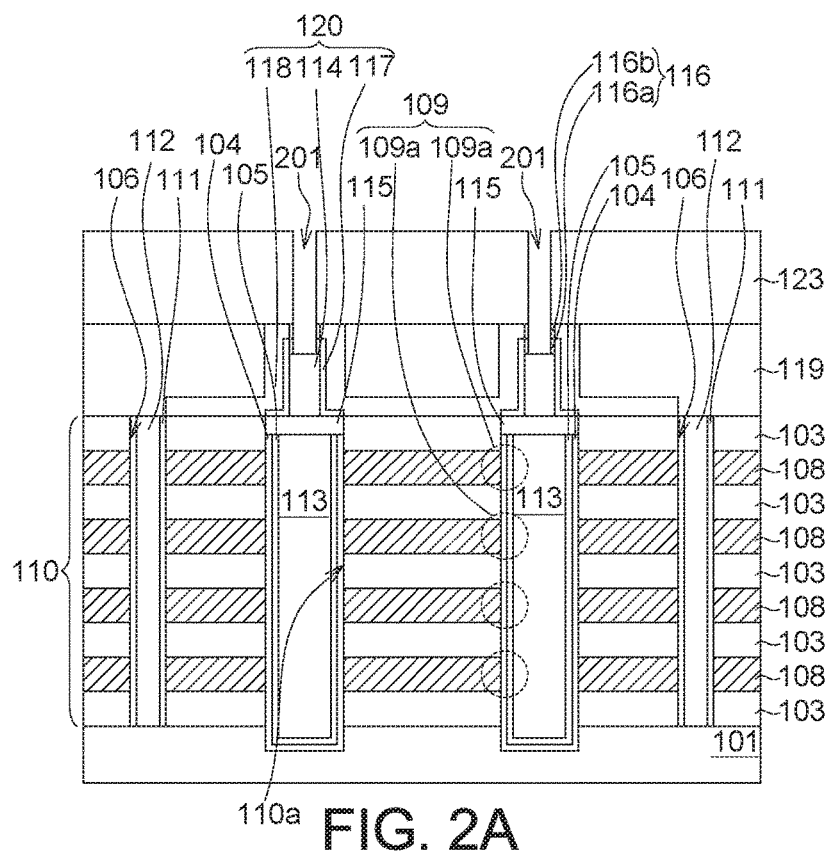
FIGS. 2A to 2C are cross-sectional views illustrating a portion of the processing structures for forming a memory device in accordance with another embodiment of the present disclosure.
Figure 2B:
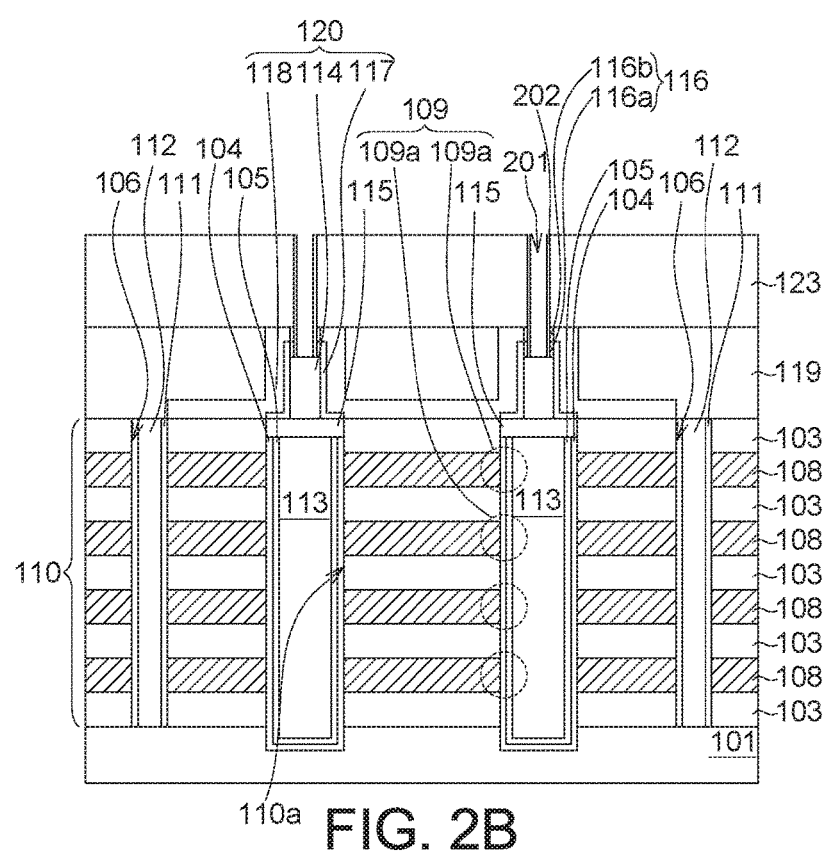
Figure 2C:
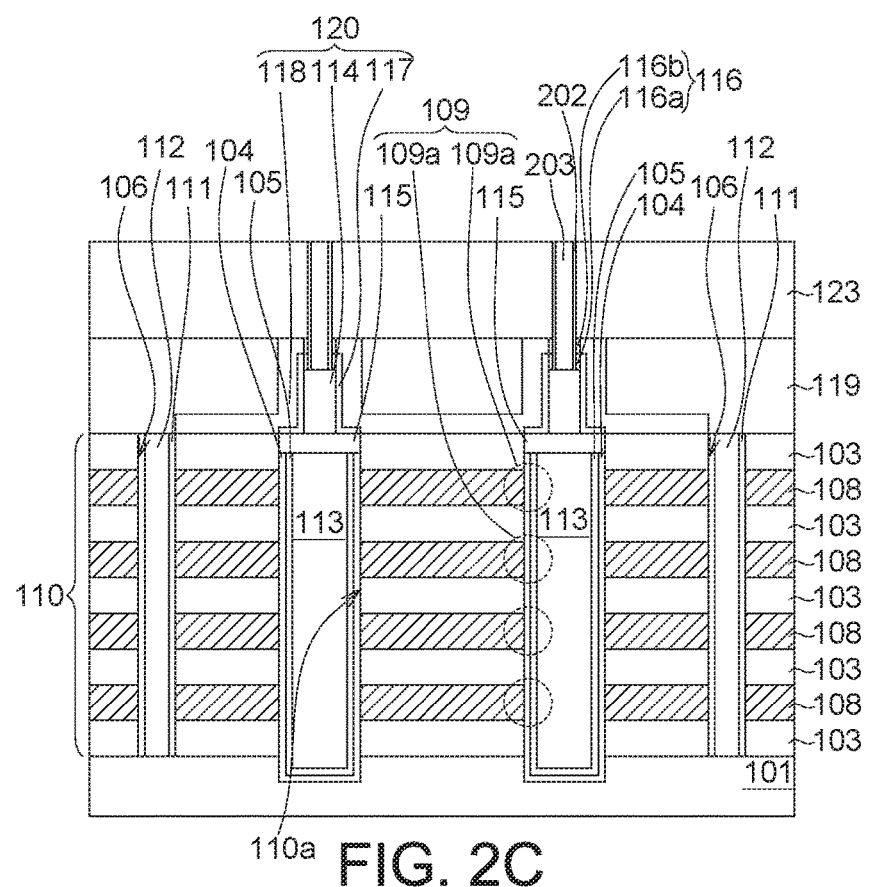

FIGS. 2A to 2C are cross-sectional views illustrating a portion of the processing structures for forming a memory device 200 in accordance with another embodiment of the present disclosure. In the present embodiment, the memory device 200 is a vertical channel NAND flash memory device. The structure of the memory device 200 is similar to that of the memory device 100, except the structure and the process for forming the bit lines 224. Since the other elements common to that of the memory device 100 has be disclosed in the processes as depicted in FIGS. 1A to 1I, thus the common processes for forming the common elements will not be redundantly described. Mere the process for forming the bit lines 224 is detailed described below.

The process for forming the bit lines 224 starts from the structure as depicted in FIG. 1I and includes steps as follows: A protection layer 123 is firstly formed on the dielectric layer 119, the patterned hard mask layer 116 and the gate 118. Next, an etching process is performed to form a plurality of vias 201 passing through the protection layer 123 and the patterned hard mask layer 116, so as to expose a portion of the second channel layer 114 there from (see FIG. A). Next, a spacer 202 is formed on the sidewalls of the vias 201 (see FIG. 2B). Subsequently, the vias 201 are fulfilled by a conductive material to form a plurality of bit lies 224, wherein the bit lies 224 electrically contact to the second channel layer 114 and to be isolated from the gate 118 by the patterned hard mask layer 116 and the spacer 202.

In accordance with the aforementioned embodiments of the present disclosure, a memory device and method for fabricating the same are provided. A SSL switch including a channel layer, a gate dielectric layer and a gate is independently formed on a multi-layers stack and electrically connected in series with a memory cells string formed in the multi-layers stack. Because the channel layer of the SSL switch is made of a material other than that for making the charge-trapping layer of the memory cells string, undesirable threshold-voltage shift of the SSL switch due to the charging of the charge-trapping layer during the programing/erasing process of the memory cells string may not occur. Such that, additional circuitry used to compensate the undesirable threshold-voltage shift is no longer required, the power consumption of the memory device can be decreased and the operation efficiency thereof may be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a multi-layers stack, including a plurality of insulating layers, a plurality of conductive layers alternatively stacked with the insulating layers and at least one first through opening passing through the conductive layers
   a charge-trapping layer, blanket over a sidewall of the first through opening;
   a first channel layer, disposed in the first through opening; and
   a string selection (SSL) switch, disposed on the multi-layers stack and comprising:
      a second channel layer, disposed on and electrically connecting to the first channel layer;
      a gate dielectric layer, disposed on the second channel layer and made of a material other than that for making the charge-trapping layer; and
      a gate, disposed on the gate dielectric layer.

2. The memory device according to claim 1, further comprising a plurality of memory cells defined at intersection points of the conductive layers, the charge-trapping layer and the first channel layer and electrically connected in series by the first channel layer.

3. The memory device according to claim 1, wherein the second channel layer comprises a columnar structure having a cross-section substantially smaller than the first through opening.

4. The memory device according to claim 3, wherein gate dielectric layer comprises silicon oxide and having a thickness substantially greater than that of the charge-trapping layer.

5. The memory device according to claim 3, wherein the second channel comprises poly-silicon, the gate comprises metal, and the gate dielectric layer comprises a high-dielectric-constant (high-K) material.

6. The memory device according to claim 3, further comprising a bond pad disposed between and electrically connecting the first channel layer and the second channel layer.

7. The memory device according to claim 3, further comprising:
   a bit line, disposed on and electrically contacting to the second channel layer; and
   an isolating material, electrically isolating the bit line from the gate.

8. The memory device according to claim 3, further comprising:
   a semiconductor substrate, on which the insulating layers and the conductive layers are stacked; and
   a contact plug, passing through the insulating layers and the conductive layers and electrically contacting to the semiconductor substrate.

* * * * *